United States Patent [19]

Mendenhall

[11] 4,110,708
[45] Aug. 29, 1978

[54] MULTICHANNEL MODULATION SYSTEM INCLUDING AUTOMATIC GAIN SHIFTER

[75] Inventor: Geoffrey N. Mendenhall, Quincy, Ill.

[73] Assignee: Harris Corporation, Cleveland, Ohio

[21] Appl. No.: 781,160

[22] Filed: Mar. 25, 1977

[51] Int. Cl.² .............................................. H03C 3/00
[52] U.S. Cl. ........................................ 332/21; 330/86; 330/282
[58] Field of Search .......................... 330/86, 282, 278; 179/1 VL, 15 AV, 15 BL; 325/404, 147, 187; 332/21, 19, 38

[56] References Cited

U.S. PATENT DOCUMENTS

| | | | |
|---|---|---|---|
| 3,470,487 | 9/1969 | Lucas et al. | 330/86 X |
| 3,619,511 | 11/1971 | Ishikawa | 179/15 BL |
| 3,714,590 | 1/1973 | Freeman et al. | 330/86 X |

FOREIGN PATENT DOCUMENTS 2,332,211  1/1975  Fed. Rep. of Germany ............. 330/86

*Primary Examiner*—James B. Mullins

[57] ABSTRACT

A switchable gain amplifier for use in an FM broadcasting system wherein the gain of a modulating signal is automatically switched to a selected level in accordance with the use or non-use of plural input channels.

4 Claims, 2 Drawing Figures

COMPOSITE OUTPUT

MULTICHANNEL MODULATION SYSTEM INCLUDING AUTOMATIC GAIN SHIFTER

BACKGROUND AND FIELD OF THE INVENTION

The present invention relates to modulation control in FM broadcasting, and more particularly to a system for automatically selecting the gain of a multichannel modulating signal in accordance with the use or non-use of the various component channels thereof.

In FM broadcasting, a carrier signal is modulated by a composite modulating signal which is comprised of a number of signals in separate frequency channels. Various SCA channels may be included in addition to the (L + R) and (L − R) channels associated with stereophonic FM broadcasting. The maximum amplitude level of this composite signal must be controlled in some manner so that modulation constraints are not exceeded. It will be noted, however, that this maximum amplitude level will be dependent upon the use or non-use of the various frequency channels, and will be greatest when all available frequency channels are in use. To prevent overmodulation in this circumstance, it has previously been the practice to adjust the gain of the composite signal when all channels were being used. In this event, however, the modulation level will necessarily decrease when various channels are deleted for one purpose or another. This can result in as much as a 30% reduction in peak modulation. Preferably, however, the peak modulation level should be maintained at as high a level as possible so as to provide the maximum degree of signal clarity and quality in subsequent reception of the modulated signal.

It is therefore desirable to provide a system which automatically selects the gain of the composite modulating signal so as to maintain peak modulation at a constant 100% in all modes of operation.

In accordance with the present invention, a plurality of input sources additionally generate binary control signals indicative of the current use or non-use status of the corresponding channel for the purpose of controlling the gain of a composite modulating signal. A signal summer is provided which combines the various input signals to provide a composite signal. The summer has a gain which is selectable in accordance with control signals supplied to gain select inputs thereto. The control signals which are supplied by the various input channels are each directed to a corresponding gain select input of the signal summer so that the gain of the composite signal is automatically selected in accordance with the use status of the various channels.

BRIEF DESCRIPTION OF THE DRAWINGS

The foregoing and other objects and advantages of the present invention will become more readily apparent from the following description of the preferred embodiment, as taken in conjunction with the accompanying drawings which are a part hereof and wherein.

DETAILED DESCRIPTION

Figure 1:
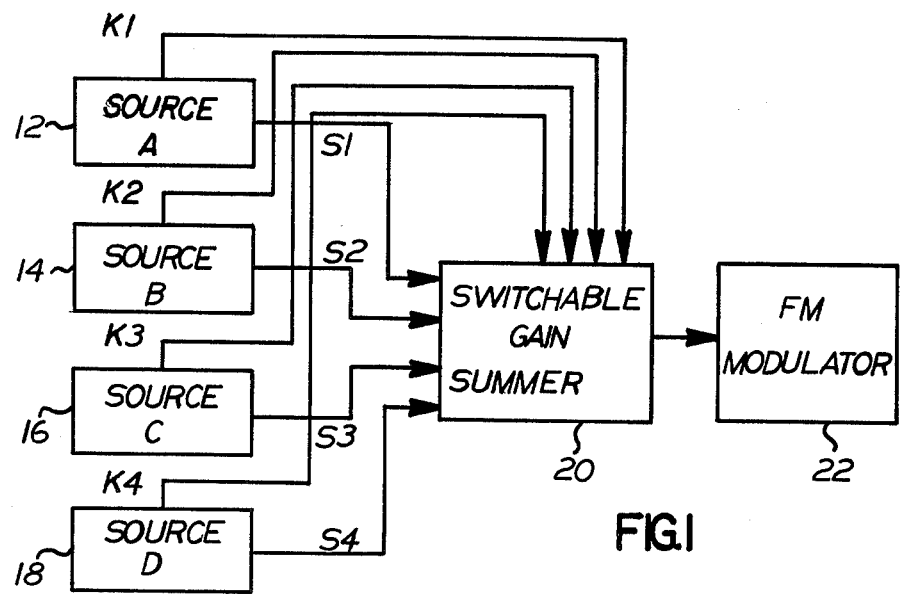
FIG. 1 is a block diagram of a preferred embodiment of the present invention.

Referring now to FIG. 1, a multichannel modulating system is provided which includes a plurality of modulating channels 12–18. Each of these modulation channels provides a binary control signal ($K_1$-$K_4$) concurrently therewith which indicates whether or not the respective channel is in use. Thus, the control signal will be at a high voltage level when the signal channel respectively associated therewith is supplying a signal which must be combined with the composite modulating signal, and will be at a low voltage level otherwise. The various signals, as well as the control signals associated therewith, are directed to a selectable gain summing circuit 20 having a gain characteristic which is selectable in accordance with the level of the control signals supplied by the respective input signals. The composite signal generated by summing circuit 20 is directed to a modulating circuit 22 which serves to modulate a carrier signal in accordance therewith.

The control signals respectively associated with the various signal channels may, for example, be generated by means of manually controlled switches (not shown) which are provided for the primary purpose of activating or deactivating the various signal sources. Thus, the same manually controlled signal which activates a modulating signal channel could serve the double duty of also selecting the gain of summer 20.

Figure 2:
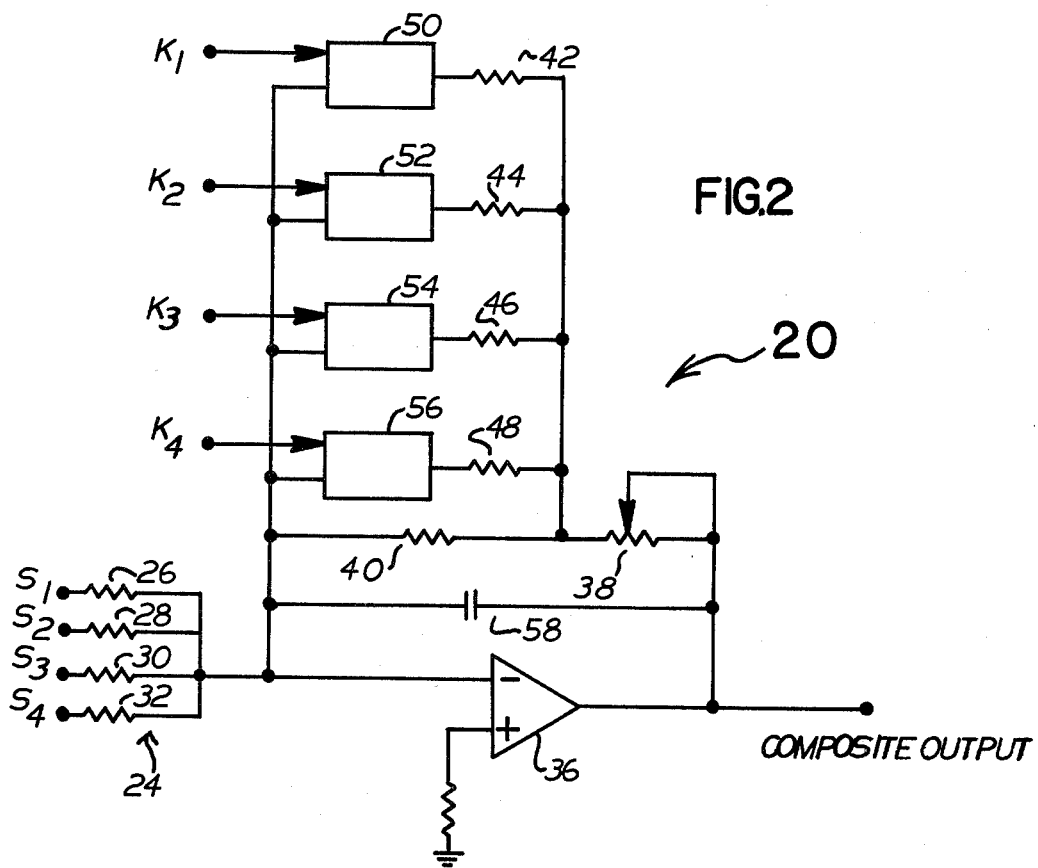
FIG. 2 is a detailed schematic drawing of the gain controlled summing amplifier of FIG. 1.

Referring now to FIG. 2, a detailed schematic illustration of summing circuit 20 is provided. It will be seen that summing circuit 20 includes an adder network 24 comprised of a plurality of resistors 26–32 which are each associated with a respective input channel. These resistors serve to additively combine the signals supplied by each of the input channels to provide a total signal which is directed to a selectable gain amplifier 36. Amplifier 36 may conveniently comprise an inverting operational amplifier of conventional design with a gain primarily established by feedback resistors 38 and 40. In addition, a separate feedback path is provided for each control signal, each path including a respective resistor 42–48 and control gate 50–56. These additional feedback paths serve to modify the gain of the amplifier by changing the impedance in the feedback network. Also, a capacitor 58 may be connected in the feedback network to provide high frequency filtering of the composite output signal.

Control gates 50–56 may be analog switches of a conventional design and may, for example, include field effect transistors as the switching element and gating circuitry for controlling the impedance level thereof. The control input to the control gates will each be interconnected with a control signal supplied by a corresponding input channel. Each of the gates will be "closed" (i.e., will have a very low impedance) when the corresponding control signal is at a high voltage level, and will be "open" (i.e., will have a very high impedance) when the corresponding control signal is at a low voltage level. Consequently, whenever one of the analog switches is closed, the resistor associated therewith will effectively be connected in parallel with resistor 40. Whenever the analog switch is open, however, the associated resistor will be effectively disconnected from the circuit. Since the gain of operational amplifier 36 is dependent upon the resistance in the feedback path, the gain provided by the operational amplifier may be selected by selecting the status of the various control signals.

The resistors associated with each of the gate circuits will be chosen in accordance with the gain change which will be required whenever the corresponding signal channel is either inserted or deleted. It will thus be appreciated that these resistors will be selected so that the peak modulation level provided by the composite output signal will remain constant regardless of the use or non-use status of the various component input signals.

Although the invention has been described with respect to a preferred embodiment, it will be appreciated that various arrangement and alteration of parts may be made without departing from the spirit and scope of the invention, as defined in the appended claims.

What is claimed is:

1. A multichannel modulating system comprising:
a modulator for modulating a carrier signal in accordance with a composite signal comprised of a plurality of component signals, wherein the modulation of said carrier must be controlled by controlling the amplitude of said composite signal;
a plurality of component signal sources for each generating one of said component signals, including means associated with each of said sources for selectively providing or not providing the associated said signal to a signal summer means, and for generating a control signal concurrently therewith having a binary state indicating whether the associated component signal is or is not being provided; and,
signal summer means for combining said component signals to form said composite signal which is supplied to said modulator and having a gain control input responsive to said binary control signals for automatically selecting the gain of said signal summer so that the peak amplitude of said composite signal will remain constant regardless of the use or non-use of said component signal sources, thereby automatically controlling modulation of said carrier.

2. A multichannel modulating system as set forth in claim 1 wherein said signal summer means comprises signal adder means for additively combining said component signals to form a sum signal, and selectable gain amplifier means for amplifying said sum signal by an amount selected by said binary control signals so as to thereby provide said composite signal.

3. A multichannel modulating system as set forth in claim 2 wherein said selectable gain amplifier means comprises an amplifier having a primary feedback path, and a plurality of switchable secondary feedback paths each corresponding to one of said component signals, and wherein said secondary feedback paths may each be selectably connected across or disconnected from said primary feedback path in dependence upon the binary state of an associated said control signal.

4. A multichannel modulating system as set forth in claim 3 wherein the impedance level of each of said secondary feedback paths is selected so that the peak amplitude of said composite signal will remain constant regardless of the use or non-use of the respective component signal sources.

* * * * *